though a United States Patent [19]
Kato

[11] Patent Number: 4,956,690
[45] Date of Patent: Sep. 11, 1990

[54] ZERO CROSSING TYPE THYRISTOR

[75] Inventor: Minoru Kato, Nagoya, Japan

[73] Assignee: Kabushiki Kaisha Toshiba, Kawasaki, Japan

[21] Appl. No.: 471,025

[22] Filed: Jan. 26, 1990

Related U.S. Application Data

[63] Continuation of Ser. No. 143,936, Jan. 14, 1988, abandoned.

[30] Foreign Application Priority Data

Jan. 26, 1987 [JP] Japan .................. 62-14231

[51] Int. Cl.5 .............. H01L 29/74; H01L 29/06; H01L 29/747; H01L 49/00
[52] U.S. Cl. ......................... 357/38; 357/20; 357/39; 357/85
[58] Field of Search ............ 357/20, 38, 39, 86

[56] References Cited

U.S. PATENT DOCUMENTS 3,508,127 4/1970 Bergman et al. ............ 357/39
4,050,083 9/1977 Jaskolski et al. ............ 357/39
4,529,998 7/1985 Lade et al. .

FOREIGN PATENT DOCUMENTS 60-74678 4/1985 Japan .
60-149164 8/1985 Japan .

Primary Examiner—Rolf Hille
Assistant Examiner—Fetsum Abraham
Attorney, Agent, or Firm—Finnegan, Henderson, Farabow, Garrett, and Dunner

[57] ABSTRACT

A zero-crossing type thyristor is formed in an N-type semiconductor substrate. A first P-type base layer, a second P-type base layer, and a first P-type emitter layer are formed in a main surface of the substrate and isolated from one another by semiconductor regions of the substrate. A second N-type emitter layer is formed in the first P-type base layer, and a third N-type emitter layer is formed in the second P-type base layer. The third N-type emitter layer is electrically connected to the first P-type base layer. A fourth P-type emitter layer is formed in an opposite surface of the substrate. The second N-type emitter layer, first P-tytpe base layer, N-type semiconductor region, and fourth P-type emitter layer constitute a vertical main thyristor of the zero-crossing type thyristor, and the third N-type emitter layer, second P-type base layer, N-type semiconductor region, and first P-type emitter layer constitute a lateral driving thyristor thereof.

11 Claims, 6 Drawing Sheets

ZERO CROSSING TYPE THYRISTOR

This application is a continuation, of application Ser. No. 07/143,936, filed Jan. 14, 1988, now abandoned.

BACKGROUND OF THE INVENTION

This invention relates to a zero-crossing type thyristor having a thyristor and a gate control element formed in the same semiconductor substrate, in a monolithic fashion, and more particularly to a thyristor having a gate control element of a thyristor structure.

A zero-crossing type thyristor is advantageously used, for the reason of reduced noise, as a power control switch provided at the final stage of a conventional temperature adjusting device, various industrial equipment, and the like. A zero-crossing thyristor can be triggered only when a voltage (anode-cathode voltage) applied between the main electrodes is within a specified narrow voltage range which includes a zero-crossing voltage. In most conventional zero-crossing thyristors, the gate control element is formed of a bipolar or MOS transistor structure such as is disclosed in Japanese Patent Disclosures No. 60-74678 and No. 60-149164.

The function of a prior art zero-crossing type thyristor will now be explained, with reference to FIGS. 8A and 8B.

FIG. 8A is a cross sectional view of the thyristor itself and FIG. 8B shows an equivalent circuit thereof. The thyristor has a MOSFET connected between the gate and cathode. Main thyristor 1 has a four layer structure which consists of P-type emitter layer 3, N-type base layer 4, P-type base layer 5, which is used as the gate, and N-type emitter layer 6. P-type layer 7, for extraction of a MOSFET driving voltage, is provided in main thyristor 1. Driving circuit 2 includes MOSFET 9 and zener diode 10 for protection of the gate oxide film formed in P-well region 8. A, K, and G respectively represent the anode, cathode, and gate electrodes of the composite thyristor.

There will now be described the operation of the thyristor wherein a forward bias voltage Vak (>0) is applied between electrodes A and K. P-type layer 7 is connected to the anode and cathode electrodes via respective electrostatic capacitors. However, since the capacitor of the former is larger than that of the latter, the potential of P-type layer 7 is set substantially equal to that of the anode electrode. In this case, when a depletion layer created between P-well region 8 and N-type base layer 4 has reached N-type base layer 7 with the increase in Vak, the value of Vak is saturated.

The gate threshold voltage of MOSFET 9 is set at, for example, 5 V. When Vak is higher than 5 V, MOSFET 9 is turned on so as to short-circuit a path between electrodes G and K of the thyristor. This causes an externally supplied trigger signal to be bypassed via MOSFET 9, preventing the thyristor from being triggered. With Vak is in the range of 0 to 5 V, MOSFET 9 is turned off so as to interrupt the short circuit path between G and K electrodes. Thus, the thyristor can be triggered when Vak is at a voltage near 5 V or within a specified narrow voltage range. When an A.C. power source voltage of commercial frequency is supplied intermittently, those prior art thyristors other than the zero-crossing type often tend to be triggered in a high A.C. voltage phase. If at this time, the load of the thyristor is reactive, the excessive voltage will give rise to a rush current or else noise, which causes LSI circuits, IC logic circuits and the like to malfunction, and causes electromagnetic disturbance in electronic equipment such as radios and televisions. Zero-crossing type thyristors were developed for the purpose of eliminating this problem, and, as such, are increasingly in demand, their field of application rapidly widening.

SUMMARY OF THE INVENTION

An object of this invention is to provide a zero-crossing type thyristor which is easy to manufacture and has a reliable zero-crossing function, in order to meet market requirements for this type of thyristor.

For brevity, first and second conductivity types are respectively denoted as N- and P-type in the following embodiment.

This invention comprises two species. The generic idea of the two species is that a main thyristor of conventional vertical type and a driving thyristor of lateral type are formed in a semiconductor substrate in a monolithic fashion. In other words, a zero-crossing type thyristor of the first species (FIG. 1A) comprises a first P-type base layer (14) of a main thyristor, a second P-type base layer (18) and a first P-type emitter layer (20) of a driving thyristor which are separately formed in a first main surface (11) of an N-type semiconductor substrate (31); a second N-type emitter layer (13) and a third N-type emitter layer (17) formed from the first main surface (11) into the first P-type base layer (14) and second P-type base layer (18), respectively; and a fourth P-type emitter layer (16) of the main thyristor formed from a second surface (12) of the N-type semiconductor substrate (31); the third N-type emitter layer (17) of the driving thyristor (33) being electrically connected to the first P-type base layer (14) of the main thyristor (32).

That portion (15) of the N-type substrate which lies between the fourth P-type emitter layer (16) and the first P-type base layer (14) serves as an N-type base layer of the main thyristor (32), while that portion (19) of the N-type substrate which lies between the first P-type emitter layer (20) and second P-type base layer (18), and exposed to the first main surface (11), functions as an N-type base layer of the driving thyristor. Thus, the main thyristor (32) constitutes a vertical thyristor which is of an NPNP structure ranging from the first main surface (11) to the second main surface (12), and has the first P-type base layer (14) as a gate layer. Meanwhile, the driving thyristor (33) constitutes a lateral thyristor which is formed separately from the main thyristor (32) and has an NPNP structure formed along the first main surface (11). The third N-type emitter layer (17) of the driving thyristor (33) is electrically connected to the first P-type gate layer (14) of the main thyristor (32), enabling an ON current of the driving thyristor (33) to be supplied as a gate current of the main thyristor (32).

The driving thyristor (33) is designed so as to have a high sensitivity by using a well known method for enhancing the amplification factor of a bipolar transistor, and is constructed so as to be turned on by a voltage Vak between the anode and cathode (which is substantially equal to voltage Vgk between the gate and cathode) set at a low voltage of, for example, 2 to 3 V. Were the anode-cathode voltage Vak to be set higher than gate-cathode voltage Vgk, the potentials on the first P-type emitter layer, the second P-type base layer (20), and the first P-type base layer (18) would be set lower than that on the N-type substrate (31), in contact with these layers. This would result in a reverse bias voltage being applied to the PN junctions between the P-type layers and the N-type substrate. To avoid this, the first P-type base layer (20) and the second P-type base layer (18) of the driving thyristor (33) are isolated from each other by the depletion layer which is created by the reverse bias voltage applied by voltage Vak, causing the driving thyristor (33) to be turned off. In other words, when Vak>Vgk, the main thyristor (32) cannot be triggered. Assuming that the threshold value of voltage Vgk by which the driving thyristor (33) is turned on is Vth, the driving thyristor (33) can have a triggering function only when Vth>Vak>0. This causes the main thyristor (32) to be triggered in response to a gate signal from the driving thyristor (33) when Vak is set substantially equal to but not higher than Vth in a specified voltage range.

In the case of the zero-crossing type thyristor of the second species (FIG. 5A), the function of the second P-type base layer (18) and third N-type emitter layer (17) of the lateral driving thyristor (33) in the first species is partially achieved by the first P-type base layer (54) and second N-type emitter layer (53) of a main thyristor (72). That is, the zero-crossing type thyristor of the second species comprises the main thyristor (72) of the vertical NPNP structure formed from the first main surface (11) to the second main surface (12); a first P-type emitter layer (60) formed separately from the first P-type base layer (54) of the main thyristor (72) and exposed to the first main surface (11); a cathode electrode K and an anode electrode A formed in contact with the second N-type emitter layer (53) and fourth P-type emitter layer (56) of the main thyristor (72), respectively; and a gate electrode G formed in contact with the first P-type emitter layer (60). That portion (59) of the semiconductor substrate lying between the first P-type emitter layer (60) and first P-type base layer (54) serves a an N-type base layer of the lateral driving thyristor (73).

When combined as described above, the first P-type emitter layer (60), N-type base layer (59), part of the first P-type layer (54), and second N-type emitter layer (53) constitute a driving thyristor (73) of lateral NPNP structure. This driving thyristor is designed so that it has a high sensitivity by using the same method employed for enhancing the amplification factor of a bipolar transistor, and is constructed so that it can be turned on by a voltage Vgk which is lower than threshold voltage Vth. The operation of this thyristor is almost identical to that of the thyristor of the first species. In other words, when Vak>Vgk, the first P-type emitter layer (60) and the first P-type base layer (54) of the driving thyristor (73) are isolated from each other, due to the presence of a depletion layer created by the reverse bias voltage which is applied by voltage Vak, thereby preventing the main thyristor (72) from being triggered. Thus, the driving thyristor has a triggering function only when Vth>Vak.

DETAILED DESCRIPTION OF THE PREFERRED EMBODIMENTS

Figure 1A:
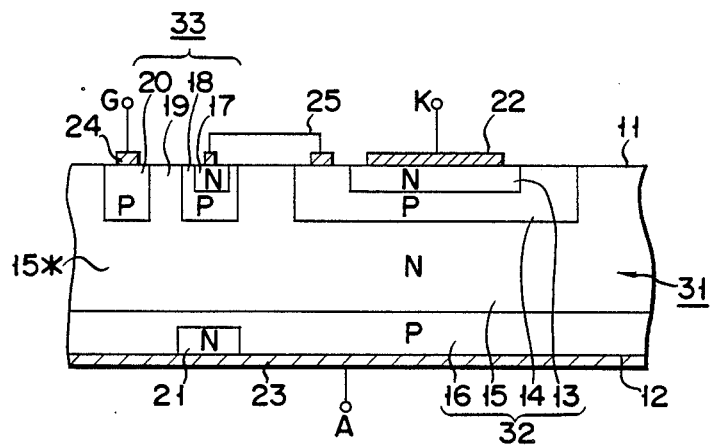
FIG. 1A is a schematic cross sectional view of a zero-crossing type thyristor according to one embodiment of this invention.

FIG. 1A is a schematic cross sectional view showing a zero-crossing type thyristor according to one embodiment of this invention. P-type base layers 14 and 18, and anode P-type emitter layer 20 are separately formed with one surface exposed to first main surface 11 of N-type semiconductor substrate 32. Further, cathode N-type emitter layers 13 and 17 are respectively formed in P-type base layers 14 and 18 with one surface exposed to first main surface 11.

Anode P-type emitter layer 16 is formed with one surface exposed to second main surface 12 of the N-type substrate, and N-type layer 21 is formed in P-type emitter layer 16 with one surface exposed to second main surface 12 and in a position opposite to P-type base layer 18. Electrode 23 is formed on layers 16 and 21 to short-circuit layers 16 and 21. That portion of the N-type substrate which lies between anode P-type emitter layer 16 and P-type base layer 14 serves as N-type base layer 15 of main thyristor 32. Further, that portion of the N-type substrate which lies between anode P-type emitter layer 20 and P-type base layer 18 and is partly exposed to the first main surface serves as N-type base layer 19 of the driving thyristor.

Main thyristor 32 has a four layer structure of cathode N-type emitter layer 13, P-type base layer 14, N-type base layer 15 and anode P-type emitter layer 16.

Lateral driving thyristor 33 has a four layer structure of cathode N-type emitter layer 17, P-type base layer 18, N-type base layer 19 and anode P-type emitter layer 20.

Cathode electrode (K) 22 is formed in contact with cathode N-type emitter layer 13, anode electrode (A) 23 is formed in contact with anode P-type emitter layer 16 and N-type layer 21, and gate (G) 24 is formed in contact with anode P-type emitter layer 20.

Cathode N-type emitter layer 17 and P-type base layer 14 of main thyristor 32 are connected with each other by means of electrode interconnecting layer 25 formed of, for example, aluminum.

Figure 1B:
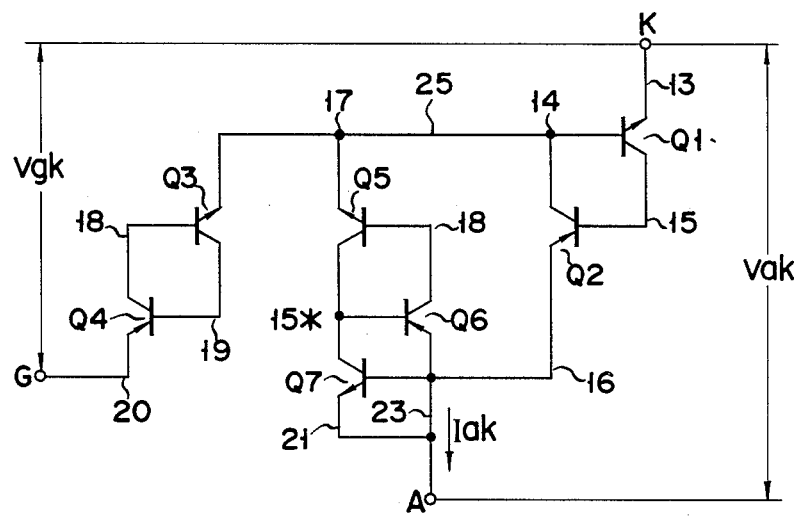
FIG. 1B shows an equivalent circuit of the zero-crossing type thyristor in FIG. 1A.

FIG. 1B shows an equivalent circuit of the thyristor of FIG. 1A. N-type layer 13 connected to cathode electrode K, P-type layer 16 formed in contact with N-type layer 13 and N-type region 15 formed in contact with the P-type layer are combined to constitute NPN transistor Q1. Likewise, P-type layer 14, N-type region 15 and P-type layer 16 connected to the anode electrode A are combined to constitute PNP transistor Q2. Main thyristor 32 is constructed by transistor Q1 and Q2.

N-type layer 17 connected to P-type layer 14 via aluminum interconnection layer 25, P-type layer 18 formed in contact with N-type layer 17 and N-type region 19 formed in contact with the P-type layer are combined to constitute NPN transistor Q3. Likewise, P-type layer 18, N-type region 19 and P-type layer 20 connected to the gate electrode G are combined to constitute PNP transistor Q4. Driving thyristor 32 is constructed by transistors Q3 and Q4.

Main thyristor 32 and driving thyristor 33 are the only elements necessary for the embodiment in FIG. 1A. However, in the structure shown in FIG. 1A, a parasitic thyristor will be created. More specifically, N-type layer 17, P-type layer 18 formed in contact with the N-type layer and N-type region 15* formed in contact with the P-type layer may be combined to form NPN transistor Q5. Likewise, P-type layer 18, N-type region 15* and P-type layer 16 formed on the side of second main surface 12 may be combined to constitute PNP transistor Q6. A first parasitic thyristor will be constructed by transistors Q5 and Q6.

If the first parasitic thyristor is erroneously turned on by, for example, Vak of a high voltage, then it becomes impossible to control the conduction state of main thyristor 32. Therefore, it is required to keep the first parasitic thyristor OFF.

In order to meet the requirement, N-type layer 21 is formed as shown in FIG. 1A. N-type layer 21, P-type layer 16 and N-type region 15* are combined to form NPN transistor Q7. Transistor Q7 constitutes a second parasitic thyristor in cooperation with PNP transistor Q6 forming the first parasitic thyristor.

Base layer 16 of NPN transistor Q7 corresponding to the gate of the second parasitic thyristor is connected to emitter layer 21 of transistor Q7 via metal electrode 23. This prevents the second parasitic thyristor to be triggered, thus keeping the same in the OFF state. Unless the second parasitic thyristor is turned on, the first parasitic thyristor including PNP transistor Q6 cannot be turned on.

There will now be described an operation of the zero-crossing type thyristor shown in FIG. 1A with reference to FIGS. 2A and 2B. In this case, a potential at the cathode electrode (K) is set at a reference level (0 V), a voltage between the gate and cathode electrodes is Vgk, a voltage between the anode and cathode electrodes is Vak, and the built in potential at the PN junction is neglected.

In the case of Vak<Vgk

Figure 2A:
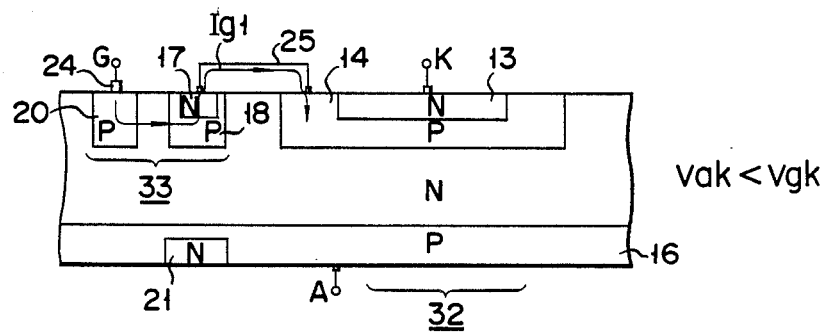
FIGS. 2A and 2B are cross sectional views for illustrating the operation of the thyristor shown in FIGS. 1A and 1B.

Assume that lateral driving thyristor 33 in FIG. 2A is formed to have a high sensitivity. Then, when Vgk exceeds low threshold voltage Vth, thyristor 33 is driven into the break down state or turned on, causing an ON current Ig1 indicated by a fine line to flow from gate electrode 24 into thyristor 33. Current Ig1 flows into P-type base layer 14 of vertical main thyristor 32 to effect the same function as an ordinary gate current, thus turning main thyristor 32 on. In this case, threshold voltage Vth at which thyristor 33 is turned on is determined by the dimensions and the distribution of impurity concentration of layers 17 to 20 of thyristor 33, and can be freely changed. In this embodiment, Vth is set to approx. 2 V.

In the case of Vak>Vgk

Figure 2B:
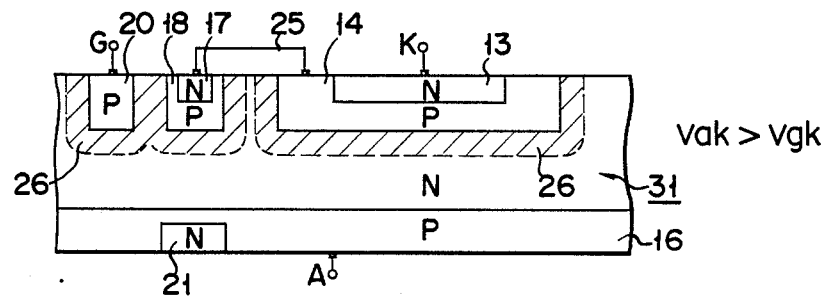

In this case, as shown in FIG. 2B, the potentials at P-type base layers 14 and 18, and anode P-type emitter layer 20 are set lower than that of N-type substrate 31, and all the PN junctions between N-type substrate 31 and P-type layers 14, 18 and 20 are reversely biased, creating depletion layers 26 as indicated by hatched portions. Since depletion layer 26 is created between the P-type emitter layer and P-type base layer of driving thyristor 33, thyristor 33 will not be turned on unless Vak<Vgk, thus keeping main thyristor 32 in the OFF state.

Since, in this embodiment, Vth of driving thyristor 33 is set at 2 V, main thyristor 32 can be turned on when Vgk is set at 2 V and Vak<Vgk. In contrast, when Vgk<Vak, main thyristor 32 cannot be turned on. Assume now that Vak is an A.C. voltage of 100 V and 50 Hz, for example. In this case, even if a gate trigger signal of 2 V is applied to the gate electrode G, main thyristor 32 will not be turned on if the A.C. voltage is in such a phase that Vak≧2 V. Main thyristor 32 is not turned on until Vak becomes near 2 V in the next A.C. cycle, thus achieving the zero-cross function.

Figure 3:
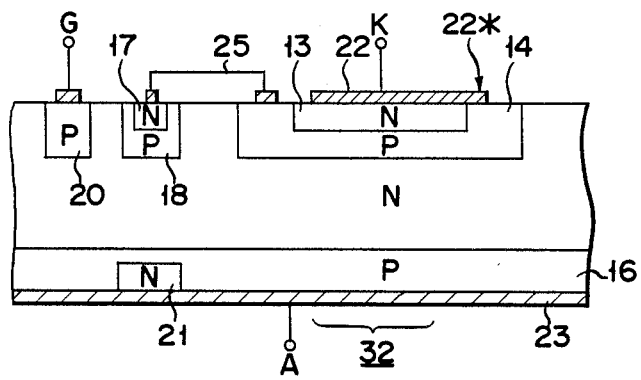
FIG. 3 is a schematic cross sectional view of a modification of the zero-crossing type thyristor shown in FIG. 1A.

FIG. 3 shows a modification of the zero-crossing type thyristor of FIG. 1A. The zero-crossing type thyristor is formed with a so-called shorted emitter structure in order to enhance withstanding value dv/dt of the main thyristor. That is, cathode electrode 22 formed in contact with cathode N-type emitter layer 13 of main thyristor 32 is formed to have portion 22* extends to the surface of adjacent P-type base layer 14, thus short-circuiting cathode layer 13 and base layer 14.

Figure 4:
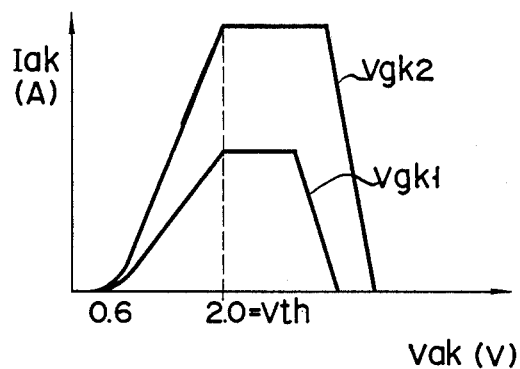
FIG. 4 is a characteristic view showing the characteristics of the thyristor of FIG. 1.

FIG. 4 is a graph showing an example of the characteristics of the zero-crossing type thyristor of FIG. 1A. The ordinate and abscissa respectively indicate current Iak flowing between the anode and cathode and voltage Vak between the anode and cathode, and Vak is changed as a parameter. Threshold voltage Vth of the thyristor is set at 2 V, Vgk1<Vgk2<2.0 (V), and two characteristic curves are taken as an example in a state immediately before the thyristor is latched or turned on.

Figure 5A:
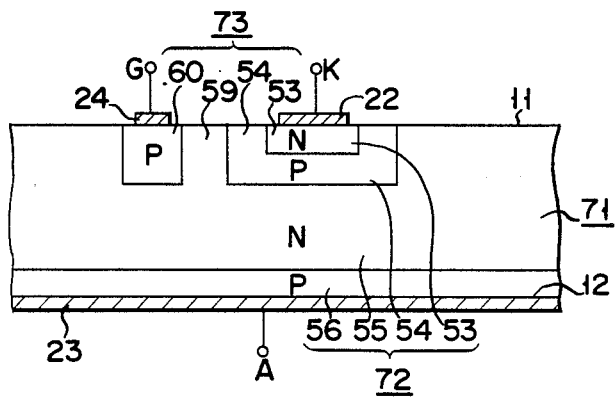
FIG. 5A is a schematic cross sectional view of a zero-crossing type thyristor according to another embodiment of this invention.

FIG. 5A shows a zero-crossing type thyristor according to another embodiment of this invention. In FIG. 5A, the same parts as those in FIG. 1A are denoted by the same reference numerals.

The zero-crossing type thyristor includes P-type base layer 54 and anode P-type emitter layer 60 formed separately from first main surface 11 of N-type semiconductor substrate 71, cathode N-type emitter layer 53 formed from first main surface into P-type base layer 54, and anode P-type emitter layer 56 formed from second main surface 12. Further, cathode electrode (K) 22 is formed on N-type emitter layer 53, anode electrode (A) 23 is formed on P-type emitter layer 56, and gate electrode (G) 24 is formed on P-type emitter layer 60. That portion of N-type substrate 71 which lies between P-type emitter layer 56 and P-type base layer 54 functions as N-type base layer 56 of main thyristor 72, and that portion of N-type substrate 71 which is placed between P-type emitter layer 60 and P-type base layer 54 and exposed in the first main surface functions as N-type base layer 59 of lateral driving thyristor 73.

In the zero-crossing type thyristor, new P-type layer 60 is formed from P-type base layer 54 of vertical main thyristor 72 and gate electrode 24 is formed on P-type layer 60. Cathode N-type layer 53 and P-type base layer 54 of main thyristor 72 also function as cathode N-type layer (53) and P-type base layer (54) of lateral driving thyristor 73, respectively.

Figure 5B:
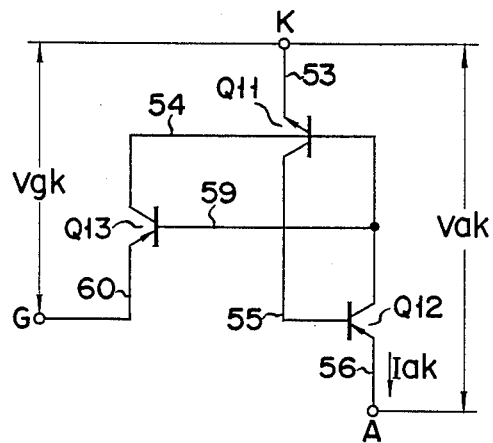
FIG. 5B shows an equivalent circuit of the zero-crossing type thyristor in FIG. 5A.

FIG. 5B shows an equivalent circuit of the device shown in FIG. 5A. N-type layer 53 connected to the cathode electrode K, P-type layer 54 formed in contact with the N-type layer and N-type region 55 formed in contact with the P-type layer 55 are combined to constitute NPN transistor Q11. Likewise, P-type layer 54, N-type region 55 and P-type layer 56 connected to the anode electrode A are combined to constitute PNP transistor Q12. Main thyristor 72 is constituted by transistors Q11 and Q12.

P-type layer 54, N-type region 59 formed in contact with the P-type layer and P-type layer 60 formed in contact with the N-type region and connected to the gate electrode G are combined to constitute PNP transistor Q13. Driving thyristor 73 is constituted by transistors Q11 and Q13.

Elements basically necessary in the embodiment of FIG. 5A are only main thyristor 72 and driving thyristor 73, and no parasitic thyristor is created in the structure of FIG. 5A. Therefore, N-type layer 21 formed in the embodiment of FIG. 2A is not necessary in the embodiment of FIG. 5A.

Figure 5C:
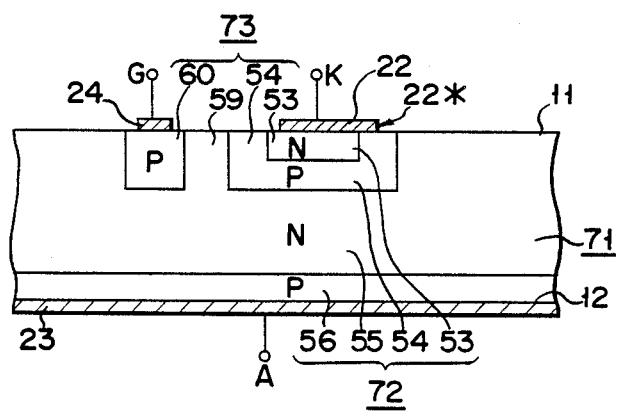
FIG. 5C is a schematic cross sectional view of a modification of the zero-crossing type thyristor shown in FIG. 5A.

Further, in the case where the thyristor of FIG. 5A is formed to have the shorted emitter structure, cathode electrode 22 is formed to have portion 22* which extends to P-type layer 54 as shown in FIG. 5C.

The operation of the thyristor shown in FIG. 5A is similar to that of the thyristor of FIG. 1A, and is briefly explained in the following.

In the case of Vak<Vgk

Figure 6A:
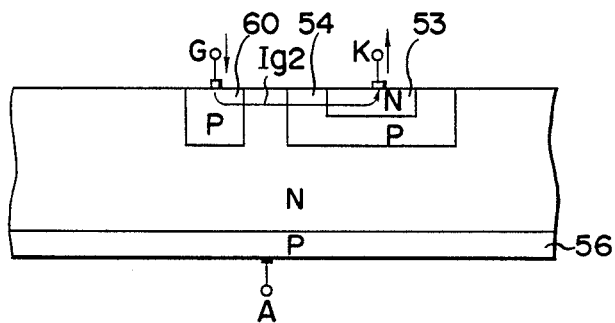
FIGS. 6A and 6B are cross sectional views for illustrating the operation of the thyristor shown in FIG. 5A.

When Vgk exceeds a predetermined level (threshold voltage Vth), a breakdown (turn-on) occurs to turn on lateral driving thyristor 73. This causes current Ig2 to flow as shown by a fine line in FIG. 6A turning on main thyristor 72. In this case, the value of Vth is dependent on the dimensions and the distribution of the impurity concentration of layers 53, 54, 59 and 60 of driving thyristor 73, and can be freely changed. In this embodiment, Vth is set at 1 V.

In the case of Vak>Vgk

Figure 6B:
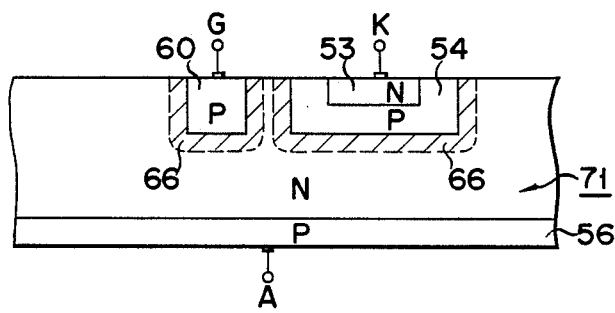

As shown in FIG. 6B, each PN junction formed between N-type substrate 71 and each of P-type base layer 54 and P-type emitter layer 60 is reversely biased to form depletion layers 66 indicated by hatched portions. Under this condition, driving thyristor 73 will not be turned on unless Vak becomes lower than Vgk, thus keeping main thyristor 72 in the OFF state. Since Vth is set at 1 V in the embodiment of FIG. 5A, main thyristor 72 can be turned on when Vgk is at 1 V and Vak is lower than Vgk and it cannot be turned on when Vak is higher than Vgk.

Figure 7:
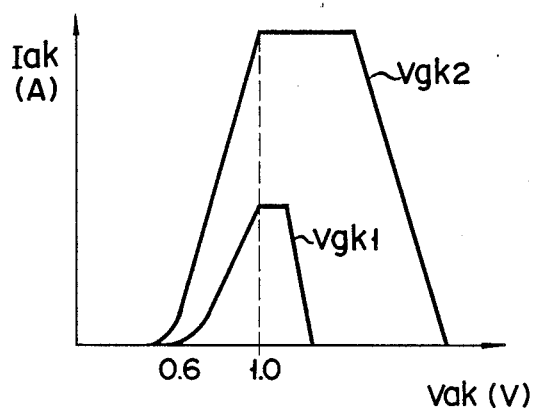
FIG. 7 is a characteristic view showing the characteristics of the thyristor of FIGS. 5A to 5C.

FIG. 7 is a graph showing an example of the characteristics of the thyristor used in the embodiment of FIG. 5A. Ordinate and abscissa respectively represent current Iak flowing between the anode and cathode of main thyristor 72 and voltage Vak between the anode and cathode, and Vgk is changed as a parameter. Threshold voltage Vth of the thyristor is set at 1 V, Vgk1<Vgk2<1.0 (V), and two characteristic curves are taken as an example in a state immediately before the thyristor is latched or turned on.

Figure 8A:
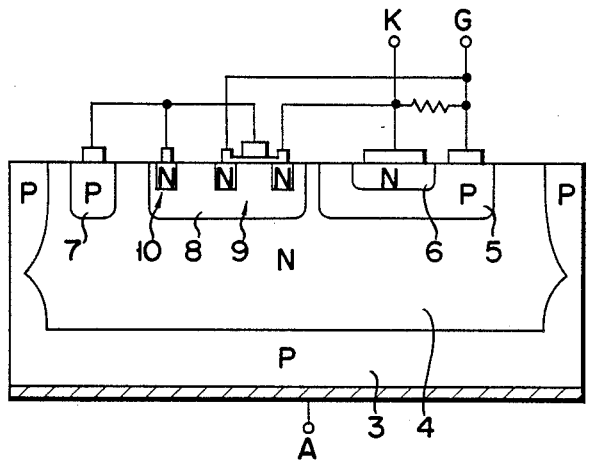
FIGS. 8A and 8B are a cross sectional view and a circuit diagram of the prior art zero-crossing type thyristor.
Figure 8B:
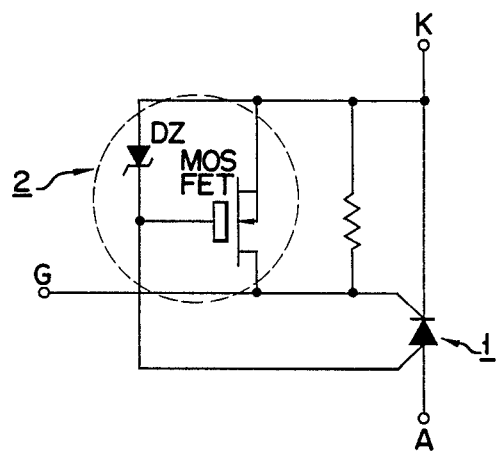

In this invention, the zero-crossing type thyristor is formed to have the lateral thyristor structure (33, 73) as a driving element so that the main thyristor (32, 72) of the vertical structure can have a zero-crossing function. Thus, it is possible to obtain a zero-crossing type thyristor which can effect a reliable zero-crossing function, and simple in construction and high in productivity as compared with the prior art thyristor such as that shown in FIG. 8A.

What is claimed is:

1. A zero-crossing thyristor comprising:
   a semiconductor substrate of a first conductivity type, having first and second main surfaces which are arranged substantially in parallel with and in opposition to each other;
   a first base layer of a second conductivity type, opposite to the first conductivity type, which is formed in said substrate and exposed to the first main surface;
   a second base layer of the second conductivity type, which is formed in said substrate and exposed to the first main surface, said second base layer being isolated from said first base layer by means of semiconductor regions constituting said semiconductor substrate;
   a first emitter layer of the second conductivity type, which is formed in said substrate and exposed to the first main surface, said first emitter layer being isolated from said first and second base layers by means of said semiconductor regions;
   a second emitter layer of the first conductivity type, which is formed in said first base layer and exposed to the first main surface;
   a third emitter layer of the first conductivity type, which is formed in said second base layer and exposed to the first main surface;
   a fourth emitter layer of the second conductivity type, which is formed in said substrate and exposed to the second main surface; and
   connecting means for connecting said third emitter layer to said first base layer,
   wherein said zero-crossing type thyristor has a gate, a cathode, and an anode which are respectively connected to said first, second, and fourth emitter layers;
   wherein said second emitter layer, first base layer, semiconductor region, and fourth emitter layer constitute a vertical main thyristor of said zero-crossing type thyristor;
   wherein said third emitter layer, second base layer, semiconductor region, and first emitter layer constitute a lateral driving thyristor of said zero-crossing type thyristor; and
   wherein the dimensions and the impurity concentrations of said second emitter layer, first base layer, semiconductor region and first emitter layer are so determined that the voltage, between the gate and cathode of said lateral driving thyristor, is more than the voltage between the anode and cathode of said vertical main thyristor, required for turning on said vertical main thyristor.

2. A zero-crossing type thyristor according to claim 1, further comprising:
   a parasitic thyristor suppression layer of the first conductivity type, which is formed in said fourth emitter layer and exposed to the second main surface, said parasitic thyristor suppression layer being formed in opposition to said second base layer which is exposed to the first main surface; and
   an anode electrode formed on said fourth emitter layer and parasitic thyristor suppression layer, and connected to the anode of said zero-crossing type thyristor, thereby permitting said parasitic thyristor suppression layer to be connected to said fourth emitter layer via said anode electrode.

3. A zero-crossing type thyristor according to claim 1, further comprising:
a cathode electrode formed on said second emitter layer and first base layer, and connected to the cathode of said zero-crossing type thyristor, thereby connecting said first base layer to said second emitter layer via said cathode electrode.

4. A zero-crossing type thyristor comprising:
a semiconductor substrate of a first conductivity type having first and second main surfaces which are arranged substantially in parallel with each other;
a first base layer of a second conductivity type, opposite to the first conductivity type, which is formed in said substrate and exposed to the first main surface;
a first emitter layer of the second conductivity type, which is formed in said substrate and exposed to the first main surface, said first emitter layer being isolated from said first base layer by means of a semiconductor region;
a second emitter layer of the first conductivity type, which is formed in said first base layer and exposed to the first main surface; and
a third emitter layer of the second conductivity type, which is formed in said substrate and exposed to the second main surface,
wherein a gate, a cathode, and an anode of said zero-crossing type thyristor are respectively connected to said first, second, and third emitter layers;
wherein said second emitter layer, first base layer, semiconductor region, and third emitter layer constitute a vertical main thyristor of said zero-crossing type thyristor;
wherein said second emitter layer, first base layer, semiconductor region, and first emitter layer constitute a lateral driving thyristor of said zero-crossing type thyristor; and
wherein the dimensions and the impurity concentrations of said second emitter layer, first base layer, semiconductor region and first emitter layer are so determined that the voltage (Vth) between the gate and cathode of said lateral driving thyristor, required for turning on said lateral driving thyristor, is more than the voltage (Vak) between the anode and cathode of said vertical main thyristor, required for turning on said vertical main thyristor.

5. A zero-crossing type thyristor according to claim 4, further comprising:
a cathode electrode formed on said second emitter layer and first base layer, and connected to the cathode of said zero-crossing type thyristor, thereby connecting said first base layer to said second emitter layer via said cathode electrode.

6. A zero-crossing type thyristor having a cathode, an anode and a gate, the thyristor comprising:
a semiconductor substrate;
a main thyristor formed vertically in said substrate, including a first NPN transistor having an emitter, a base and a collector, and a first PNP transistor having an emitter, a base and a collector, said emitter of said first NPN transistor forming the cathode of the zero crossing type thyristor and said emitter of said first PNP transistor forming the anode of the zero crossing type thyristor; and
a driving thyristor formed laterally in said substrate, including a second NPN transistor having an emitter, a base and a collector, and a second PNP transistor having an emitter, a base and a collector, said emitter of said second PNP transistor forming the gate of the zero crossing type thyristor,
the dimensions and impurities of regions within said semiconductor substrate forming said main thyristor and said driving thyristor being so determined that a voltage (Vth) between the gate and cathode of said zero crossing type thyristor, required for turning on said driving thyristor, is more than a voltage (Vak) between the anode and cathode of said zero crossing type thyristor, required for turning on said main thyristor.

7. A zero-crossing type thyristor as recited in claim 6, further comprising a first parasitic thyristor connected between said main thyristor, said driving thyristor and the anode.

8. A zero-crossing type thyristor as recited in claim 7, wherein said first parasitic thyristor comprises a third NPN transistor and a third PNP transistor.

9. A zero-crossing type thyristor as recited in claim 7, further comprising a second parasitic thyristor connected between said first parasitic thyristor, said main thyristor and the anode.

10. A zero-crossing type thyristor as recited in claim 9, wherein said second parasitic thyristor comprises a fourth NPN transistor.

11. A zero-crossing type thyristor having a cathode, an anode and a gate, the thyristor comprising:
a semiconductor substrate;
a main thyristor formed vertically in said substrate, including a first NPN transistor having an emitter, a base and a collector, and a first PNP transistor having an emitter, a base and a collector, said emitter of said first NPN transistor forming the cathode of the zero crossing type thyristor and said emitter of said first PNP transistor forming the anode of the zero crossing type thyristor; and
a driving thyristor formed laterally in said substrate, including said first NPN transistor and a second PNP transistor having an emitter, a base and a collector, said emitter of said second PNP transistor forming the gate of the zero crossing type thyristor,
the dimensions and impurities of regions within said semiconductor substrate forming said main thyristor and said driving thyristor being so determined that a voltage (Vth) between the gate and cathode of said zero crossing type thyristor, required for turning on said driving thyristor, is more than a voltage (Vak) between the anode and cathode of said zero crossing type thyristor, required for turning on said main thyristor.

* * * * *

UNITED STATES PATENT AND TRADEMARK OFFICE
CERTIFICATE OF CORRECTION

PATENT NO. : 4,956,690

DATED : September 11, 1990

INVENTOR(S) : Minoru Kato

It is certified that error appears in the above-identified patent and that said Letters Patent is hereby corrected as shown below:

On the title page, item [54] and in col. 1, line 2, in the title change "ZERO CROSSING" to --ZERO-CROSSING--.

On the title page, in the Abstract, line 12, change "P-tytpe" to --P-type--.

Claim 1, column 8, line 4, before "tyristor" insert --type--.

Claim 1, column 8, line 50, after "voltage" insert --($V_{th}$)--.

Claim 1, column 8, line 52, after "voltage" insert --($V_{ak}$)--.

Signed and Sealed this

Nineteenth Day of January, 1993

*Attest:*

DOUGLAS B. COMER

*Attesting Officer*    *Acting Commissioner of Patents and Trademarks*